(12) United States Patent
Mustanir et al.

(10) Patent No.: US 9,966,326 B2
(45) Date of Patent: May 8, 2018

(54) LEAD FRAMES WITH WETTABLE FLANKS

(71) Applicant: UNISEM (M) BERHAD, Kuala Lumpur (MY)

(72) Inventors: Mustanir, Batam (ID); Maria Cristina T. Santillan, Novaliches (PH); Debie Agung Setiawan, Batam (ID); Yulia Natilova, Batam (ID); Gunarto Wibowo, Batam (ID)

(73) Assignee: UNISEM (M) BERHAD, Kuala Lumpur (MY)

( * ) Notice: Subject to any disclaimer, the term of this patent is extended or adjusted under 35 U.S.C. 154(b) by 0 days. days.

(21) Appl. No.: 14/659,310

(22) Filed: Mar. 16, 2015

(65) Prior Publication Data

US 2016/0276251 A1    Sep. 22, 2016

(51) Int. Cl.
*H01L 23/495*    (2006.01)
*H01L 21/56*    (2006.01)
(Continued)

(52) U.S. Cl.
CPC .... *H01L 23/49541* (2013.01); *H01L 21/4842* (2013.01); *H01L 21/561* (2013.01); *H01L 23/3107* (2013.01); *H01L 23/49513* (2013.01); *H01L 23/49582* (2013.01); *H01L 24/97* (2013.01); *H01L 24/16* (2013.01); *H01L 24/29* (2013.01); *H01L 24/32* (2013.01); *H01L 24/33* (2013.01); *H01L 24/73* (2013.01); *H01L 24/83* (2013.01); *H01L 24/85* (2013.01); *H01L 24/92* (2013.01); *H01L 25/0657* (2013.01); *H01L 2224/16245* (2013.01); *H01L 2224/293* (2013.01); *H01L 2224/2919* (2013.01); *H01L 2224/2929* (2013.01); *H01L 2224/29083* (2013.01); *H01L 2224/29294* (2013.01); *H01L 2224/29299* (2013.01); *H01L 2224/32145* (2013.01); *H01L 2224/32245* (2013.01); *H01L 2224/33181* (2013.01); *H01L 2224/48091* (2013.01); *H01L 2224/48105* (2013.01); *H01L 2224/48247* (2013.01); *H01L 2224/73215* (2013.01); *H01L 2224/73265* (2013.01);
(Continued)

(58) Field of Classification Search
CPC . H01L 23/495; H01L 21/50; H01L 23/49541; H01L 21/4842
See application file for complete search history.

(56) References Cited

U.S. PATENT DOCUMENTS 6,812,552 B2    11/2004    Islam
7,129,116 B2    10/2006    Islam
(Continued)

*Primary Examiner* — Marc Armand
(74) *Attorney, Agent, or Firm* — Wiggin and Dana LLP; Gregory S. Rosenblatt; Andrew D. Bochner

(57) ABSTRACT

A method of producing wettable fillets in electronic packages. A matrix of unsingulated lead frames is provided, each including a plurality of lead elements and a chip pad. Chips are attached to the chip pads and terminals on the chips are electrically connected to lead portions of the lead elements. The top portion of the package is encapsulated. Masking is applied to the bottom surface of the lead elements and the chip pads, but at least one of the lead elements has a portion of its surfaced remaining exposed. The exposed lead element surface is etched to create a fillet. The fillets, lead elements and bottom surface of the chip pads are plated, and the packages then singulated, producing packages with wettable flanks.

17 Claims, 18 Drawing Sheets

(51) Int. Cl.
*H01L 21/48* (2006.01)
*H01L 23/31* (2006.01)
*H01L 23/00* (2006.01)
*H01L 25/065* (2006.01)

(52) U.S. Cl.
CPC ............ *H01L 2224/834* (2013.01); *H01L 2224/83101* (2013.01); *H01L 2224/83192* (2013.01); *H01L 2224/83411* (2013.01); *H01L 2224/83801* (2013.01); *H01L 2224/83855* (2013.01); *H01L 2224/85439* (2013.01); *H01L 2224/85444* (2013.01); *H01L 2224/92242* (2013.01); *H01L 2224/92247* (2013.01); *H01L 2224/97* (2013.01); *H01L 2924/00014* (2013.01); *H01L 2924/181* (2013.01)

(56) References Cited

U.S. PATENT DOCUMENTS

| | | | |
|---|---|---|---|
| 7,790,500 B2 | 9/2010 | Ramos | |
| 7,799,611 B2 | 9/2010 | Ramos | |
| 2002/0084518 A1* | 7/2002 | Hasebe | H01L 23/3107 257/676 |
| 2008/0258278 A1* | 10/2008 | Ramos | H01L 24/36 257/676 |
| 2011/0111562 A1* | 5/2011 | San Antonio | H01L 21/4832 438/113 |
| 2013/0105957 A1* | 5/2013 | Watanabe | H01L 23/49548 257/676 |

* cited by examiner

LEAD FRAMES WITH WETTABLE FLANKS

FIELD OF THE DISCLOSURE

The subject matter of the present disclosure generally relates to electronic packaging, and more particularly relates to packages with wettable flanks and methods for making the same.

BACKGROUND OF THE DISCLOSURE

Various methods and configurations of electronic packages have been previously detailed. For instance, U.S. Pat. Nos. 7,790,500, 7,799,611, 7,129,116, 6,812,552, each entitled "Partially Patterned Lead Frames and Methods of Making and Using the Same in Semiconductor Packaging" and filed Oct. 24, 2007, Oct. 26, 2006, Aug. 10, 2004 and Apr. 29, 2002, respectively, are directed to near-chip scale packages. The disclosures of U.S. Pat. Nos. 7,790,500, 7,799,611, 7,129,116, 6,812,552 are incorporated by reference herein in their entirety.

In making electronic packages that use lead frames, there are several process steps that subject the lead frames to mechanical and thermal stresses. The finer geometries of current lead frames and the ever-increasing integration of circuits on semiconductor chips have resulted in processing that places even greater stress on the lead frames. Finely configured lead frames often resemble very delicate embroidery, or stencil-like metal structures that tend to bend, break, disfigure and deform easily. Many conventional lead frames are used in the industry to create a variety of chip packages, including wire bonded and flip-chip (FC) packages.

Conventional lead frames often lack structural rigidity. The finger-like portions of lead frames can be quite flimsy and difficult to hold in position. This leads to handling flaws, damage and distortion in assembly processes and complicated wire bonding situations. Consequently, bond parameters have to be optimized to compensate for lead frame bouncing during the bonding process. A failure to optimize the bonding parameters to compensate for the mechanical instability of the lead frame can result in poor bond adhesion, and hence poor quality and poor reliability of the bond.

The large metal plate portions of a typical lead frame extend from a central portion, known as the chip receiving area, also known as a chip-pad. The chip is usually attached to the receiving area with the backside down, and the side of the chip with electronically conductive circuit traces positioned face up with terminals located peripherally on the perimeter of the chip, or over the surface of the chip in the form of an array. The receiving area typically has dimensions of about 5 mm×5 mm, and the leads extending outwardly from the chip-pad area have typical dimensions of about 10 mm long×1 mm wide×0.2 mm thick. The lead frame is typically held down by a vacuum chuck and mechanical clamps. The chuck and clamps must be refitted for lead frames of different sizes and shapes.

Quad flat no-lead (QFN) packages, whose lead surfaces are often electronically connected to printed circuit boards via solder balls, may have these connections severed when subjected to rigorous stress in certain applications, such as in automobiles. Furthermore, inspection and verification of the quality of such connections may be difficult to verify visually and without physically stressing the connections.

The subject matter of the present disclosure is directed to overcoming, or at least reducing the effects of, one or more of the problems set forth above.

BRIEF SUMMARY OF THE DISCLOSURE

Disclosed is a package, particularly a QFN package, having wettable flanks.

In some embodiment methods, an original lead frame is initially provided. However, in some instances the lead frame may be manufactured as part of the overall process. In a particular embodiment, a lead frame is constructed from a film having a top surface and a bottom surface. A first region of the film is partially patterned from the top surface but not entirely through the film to the bottom surface. A second region of the film, not patterned from the top surface, forms a chip receiving area for supporting an integrated circuit (IC) chip and a plurality of lead contacts for providing electrical connections to the IC chip. The first region forms trenches in the film and creates a webbed structure that interconnects the second region that is not partially patterned from the top surface. Patterning may utilize standard photolithographic techniques or similar techniques to outline the areas that will correspond to a chip receiving area and leads. The lead frame of the disclosure has beneficial structural rigidity because of its web-like, or webbed structure. Adjacent lead frames initially share lead elements, which facilitates the production of wettable flanks later in the production process. Preferably, multiple packages are manufactured simultaneously in a production matrix.

Next, etching is performed in the first region of the film outside the outlined areas from the top surface of the film partially through the thickness of the underlying film to create a lead frame pattern in the film. After the partial patterning, the remaining areas not patterned from the top surface form a second region, which will serve as a chip receiving area and leads along the top surface. The first region forms a recessed webbed region below the top surface of the film. The webbed structure of the first region connects the lead portions to each other and to the chip receiving area. Thus, the partially patterned film looks similar to a webbed foot and retains its rigidity and strength.

The lead frame material may be pre-patterned with a resist material. The resist can be a metal or a non-metal, such as an organic resist, and can be oven-cured or UV-cured. Pre-patterning process are known in the art. Alternatively, the lead frame may be printed with a printable ink, such as an epoxy ink or a stenciling ink, or an organic material, such as a polyimide resin, as an etching mask. Masking with a printable ink or an organic substance is typically less costly than masking with a precious metal such as palladium, gold, platinum, rhodium, silver, or ruthenium, or alloys thereof, examples of substances which have been used for pre-plating lead frames. In addition, removing the ink after etching is typically easier than removing the precious metal.

Etching the bottom of the lead frame matrix can result in a matrix of lead elements and chip-pads. Several advantages arise from the partially patterned lead frame. For instance, the solid structure provides a continuous surface for a universal vacuum chuck to hold the lead frame down.

Whether provided or manufactured as part of the process, once a matrix of lead frames is available for further processing, chips are attached to the chip-pads using an adhering material, such as epoxy. Each chip has terminals for attachment to a corresponding lead frame. Once each chip is attached, electrical connection is formed between at least one terminal of each chip and one of the electrical lead portions of the lead frame. Thereafter, an encapsulant material is applied over the lead frames to completely cover the top of the package. Once the encapsulant material is dried or otherwise cured as required, masking is then applied to the bottom surface of the film, and at least a subset of the lead elements are etched so as to create fillets. Preferably, fillets are formed in the bottom middle surface of each lead element, so that when singulated each package has a wettable flank. The fillets, leads and bottom surfaces of the chip pads are plated and the individual packages then singulated. As a result, the final packages include wettable flanks suitable for serving as the basis for robust connections. One of ordinary skill in the art to which the present disclosure pertains will understand various means are suitable for electrical interconnection of the chip with the lead frame. For instance, flip chip (FC) technology, the operation of which is known to those of skill in the art, may be employed to join chips with the chip pads.

Plating may be accomplished with solderable materials through immersion-tin dipping or electroless-nickel plating. Masking may be accomplished using any convenient or conventional masking substance, such as a printable ink, a stenciling ink, an epoxy ink, or an organic substance. The lead frame may be formed of any suitable substance known in the art. For example, the lead frame be made of a film of copper or a copper alloy, or another metal or metal alloy. The chips may be attached using an adhesive or other tactile or fixative substance known in the art. For example, the adhesive may be a resin, an epoxy resin, a solder paste, or a tape. The lead frames may be formed using conventional processes, for example, by chemical etching, stamping, or coining.

The bottom surface of the lead frame may be patterned with hatchings, channels, or both.

BRIEF DESCRIPTION OF THE DRAWINGS

The foregoing summary, preferred embodiments, and other aspects of the present disclosure will be best understood with reference to a detailed description of specific embodiments, which follows, when read in conjunction with the accompanying drawings, in which.

Like reference numbers and designations in the various drawings indicate like elements.

DETAILED DESCRIPTION

Disclosed is a method of manufacturing a lead frame package having wettable flanks that are suitable for connection in applications requiring rigidity and ease of inspection.

Figure 1A:
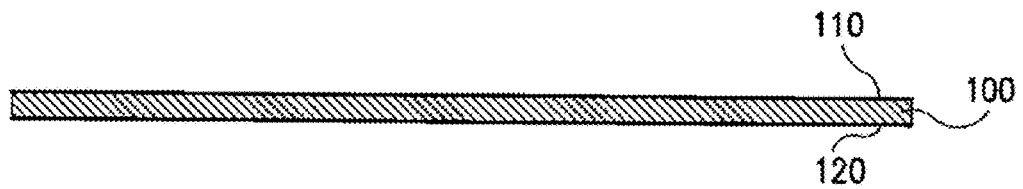
FIG. 1A is a cross-sectional view of a metal film of uniform thickness pre-plated on a top side.
Figure 1B:
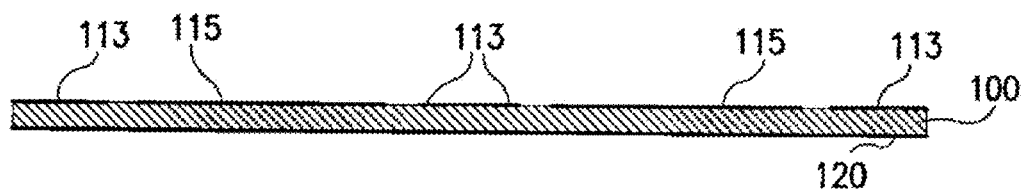
FIG. 1B is a cross-sectional view of a metal film of FIG. 1A, where the top surface has been patterned corresponding to two chip sites.
Figure 1C:
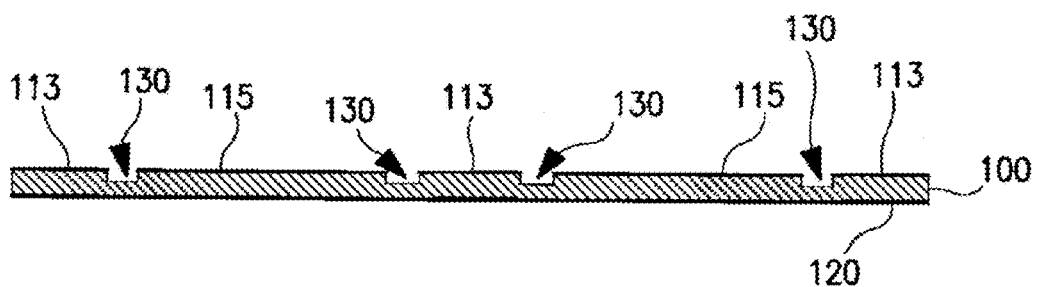
FIG. 1C is a cross-sectional view of the plated metal film of FIG. 1B, which has been partially patterned.

Lead frames may be provided as an initial step in certain embodiment methods or may be an integrated portion of a production process. Certain methods of producing lead frames are known to those of skill in the art to which the present application pertains. FIGS. 1A-1C illustrate a particular process by which a lead frame may be constructed. Particularly, the lead frame is partially patterned on a top side and is solid and flat on the bottom. The bottom surface is partially etched through to isolate a number of lead elements from the chip-pad and other leads in the same package. FIG. 1A is a cross-sectional view of a film, preferably a sheet of metal, and more preferably copper. The thickness of the strip of metal may be equal to or greater than about 0.05 mm. In another embodiments, the thickness can be in a range between about 0.05 to 0.5 mm.

Forming a lead frame typically involves cutting through the strip of metal, like cutting a stencil, and then working with very fine finger-like leads. In order to hold down such a delicate structure in place, a vacuum chuck may be used. Conventional vacuum chucks, however, typically are not adapted to provide suction for such delicate devices and the lead frame must usually be clamped down peripherally. Any rigging used for this purpose must be refitted from one type and size of lead frame to another. Where the original lead frame for embodiments is constructed according to this process, this refitting step is unnecessary because the bottom surface of the partially patterned lead frame is solid and continuous, allowing a conventional vacuum chuck to hold the lead frame in place during certain processing steps.

Forming of the various patterns on the lead frame can be accomplished in a number of ways. One approach can be stamping/coining the pattern into the metal. Other approaches may include chemical or electrochemical milling and electrical discharge machining (EDM). On the other hand, photolithographic patterning may be employed. In the process of FIG. 1A, metal strip 100 is pre-plated on top side 110 and also has a bottom side 120. The pre-plating may employ a material that enables bonding and/or solderability. In one embodiment, top surface 110 is pre-plated with a bondable material. Other examples of pre-plating materials include wire-bondable materials such as Ni/Pd/Au-strike and silver (Ag), and solderable materials such as Sn/Pb, lead-free solder, immersion-tin electroless nickel, or Au (gold) strike. As illustrated in FIG. 1B, top side 110 is photolithographically patterned to form areas corresponding to chip-pads 115 and electrical contacts 113 surrounding the chip-pad area. An electrical contact 113 can be characterized as the end portion of a lead that is connected to the chip-pad area 115 through a first region of intermediate recessed portions that forms the web-like structure. These intermediate recessed web-like portions are removed at a later time when metal film 100 is etched from the back so that the end portions and the chip-pad portions will be isolated from each other. The areas including chip-pads 115 and the surrounding contacts 113 are sometimes referred to as chip sites. A plurality of chip sites can be formed on a continuous roll of copper sheet sprocketed to a spool to easily automate the forming of lead frames comprising one or more chip sites. FIG. 1B illustrates two chip sites, which will be formed into two corresponding lead frames, which in turn will be part of two packages that will be formed from them.

The pattern shown for the two chip sites illustrated in FIG. 1B is then transferred into film strip 100 by etching. As shown in FIG. 1C, the etching is performed only partially through the thickness of the metal, which is referred to herein as partial patterning. The partial patterning is performed in a first region of the film to form a webbed structure 130 that connects chip pads 115 and lead contacts 113 of each lead frame. In one embodiment, the partial patterning can vary from 25% to 90% of the thickness of the film. The partial patterning, however, may be virtually any percentage of the thickness of the film and the amount of partial etching can be determined by considering various factors affecting the manufacturability parameters, including flexibility, rigidity, and thermal thickness (or thermal conductance). The bottom portion of the leadframe may be etched at a desired time so as to separate the lead elements from the chip pads.

Figure 2:
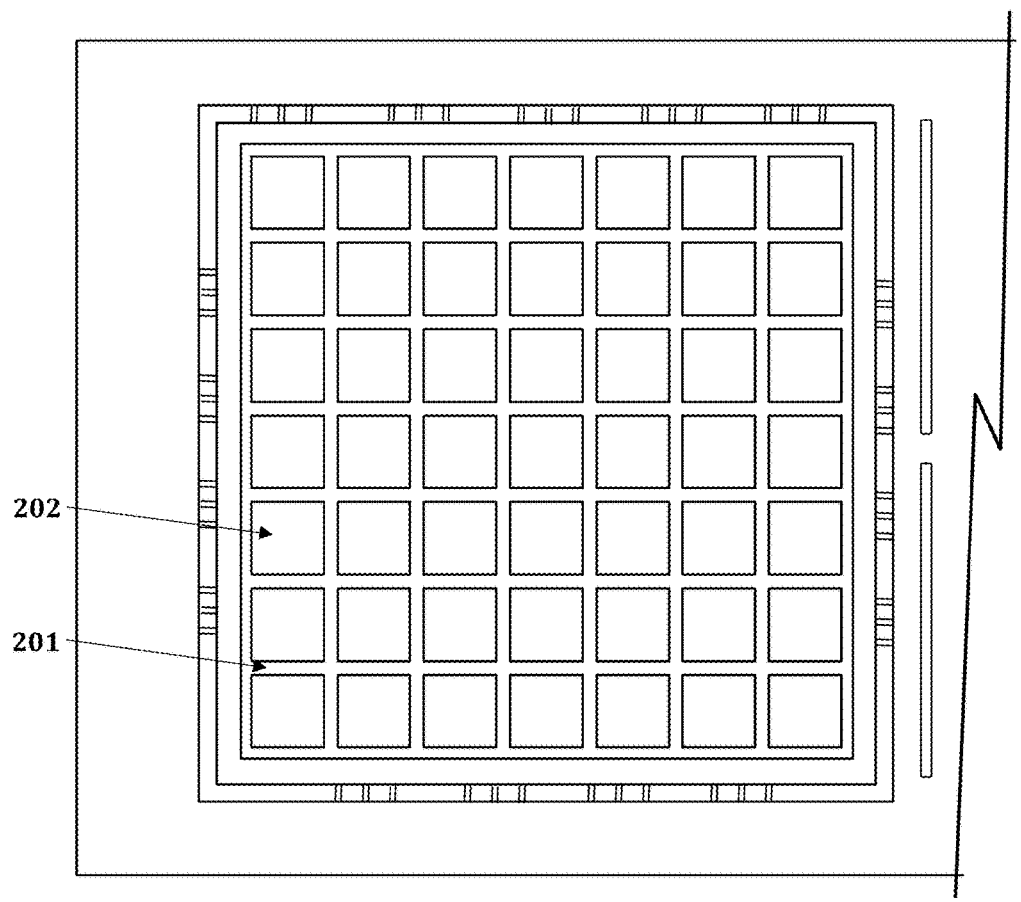
FIG. 2 is a bottom view of a production matrix of packages.
Figure 3:
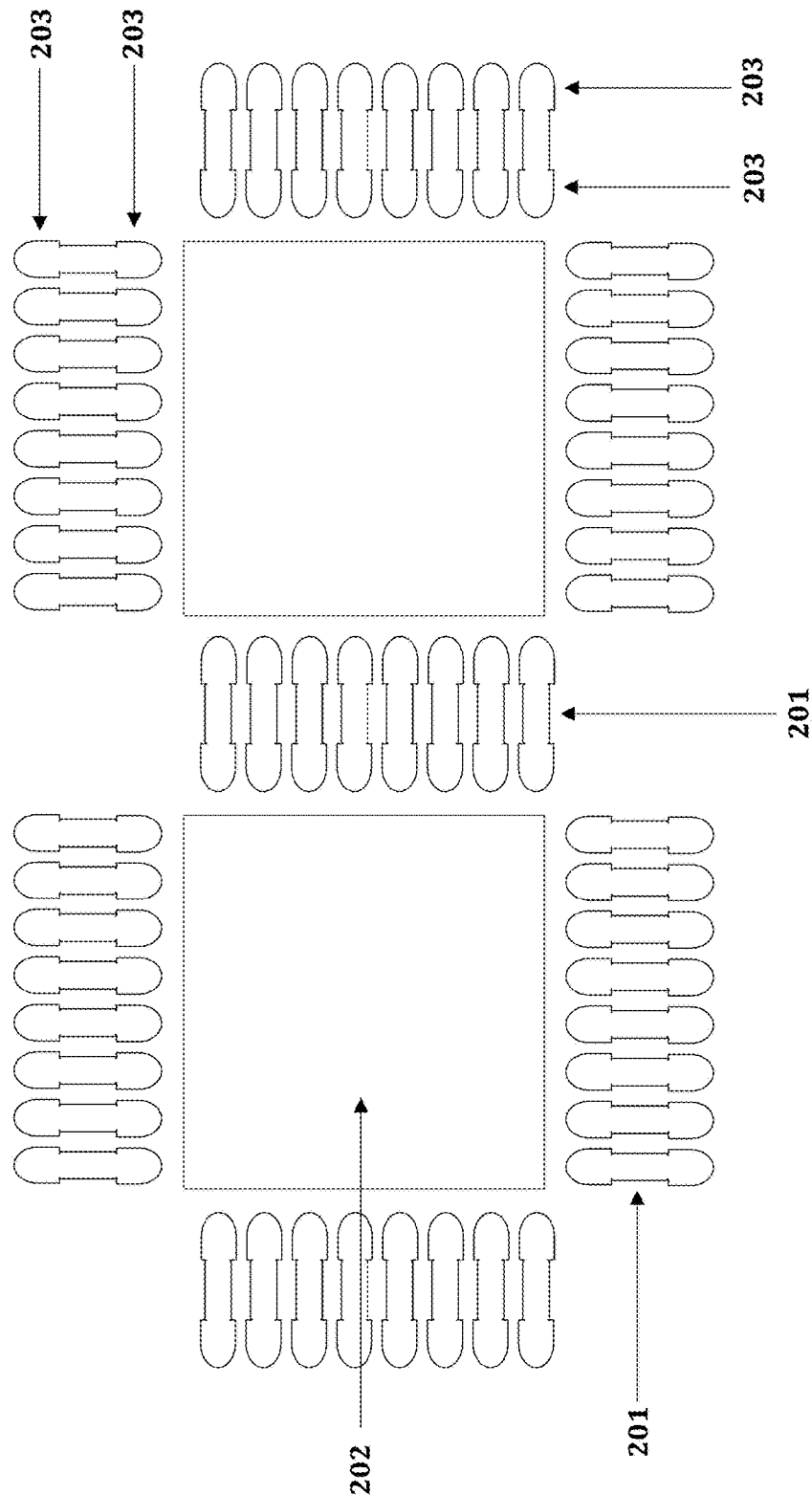
FIG. 3 is a close-up bottom view of two adjacent packages in a production matrix.

FIG. 2 is schematic bottom view of a production matrix of lead frames. In between chip-pads 202 and on the periphery of the matrix are lead element rows 201. FIG. 3 is a close up view of two adjacent packages 202 of the production matrix of FIG. 2. Lead elements 201 contain leads 203, which during the production process are a single component. Singulation of the package also separates leads 203 between the respective packages to which the leads belong. As one component during process, lead elements 201 allow for the production of filleted flanks.

Figure 4:
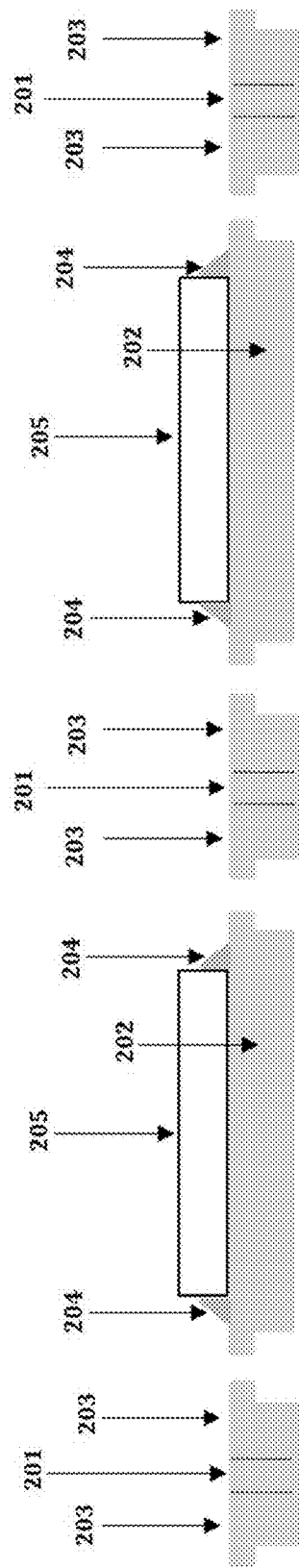
FIG. 4 is a cutaway schematic side view of the attachment of a chip to a chip-pad.

FIG. 4 is a cutaway schematic side view of a QFN package during production according to an embodiment method. As explained above, lead elements 201 are composed of the joined leads 203 of adjacent packages in the manufacturing matrix. In the embodiment, chip-pads 202 serve as bases for semiconductors or integrated circuit chip 205, which are attached to chip-pads 202 via adhering substance 204, which may be any suitable substance such as epoxy. The adhesive can optionally be applied as a fluid or viscous liquid which will then harden or form internal cross-links to form a strong, durable bond. Epoxy may be filled with thermally conductive particles to enhance the cooling of the chip. In an alternative, solder paste may be used in place of epoxy to provide both a stronger bond between the chip and the chip-pad, and a more effective cooling path to the ambient environment. The epoxy or other adhering substance is cured if necessary before proceeding. The thickness of the adhesive should be sufficiently thick to have mechanical stability.

In other embodiments, the adhesive can be in the form of a tape, such as a polyimide adhesive tape. The tape typically consists of a base film coated with an adhesive substance such as a thermoplastic polymer on both sides, and the tape may be tacky or tack-free. In further embodiments, the adhesive is a solid plastic substance which cures or solidifies in place to provide strong attachment between the chip and the lead frame. Various kinds of adhesives, tapes, and other die attach materials are known and available commercially.

Figure 5:
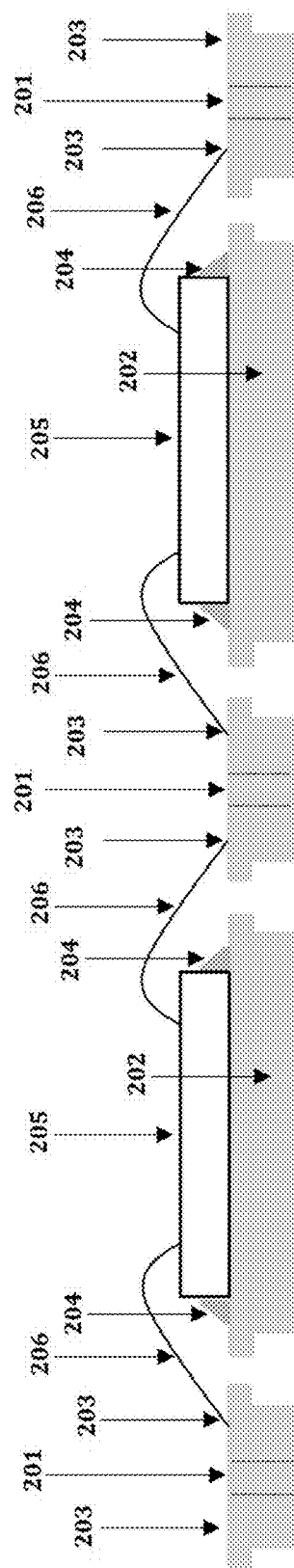
FIG. 5 is a cutaway schematic side view of the wire bonding of chips to the lead frame.

FIG. 5 illustrates wire bonding of chips 205. Wires 206 electrically connect terminals on chips 205 to lead contacts on leads 203. Techniques for wire bonding are well known to those of skill in the art to which the present disclosure pertains.

Figure 6:
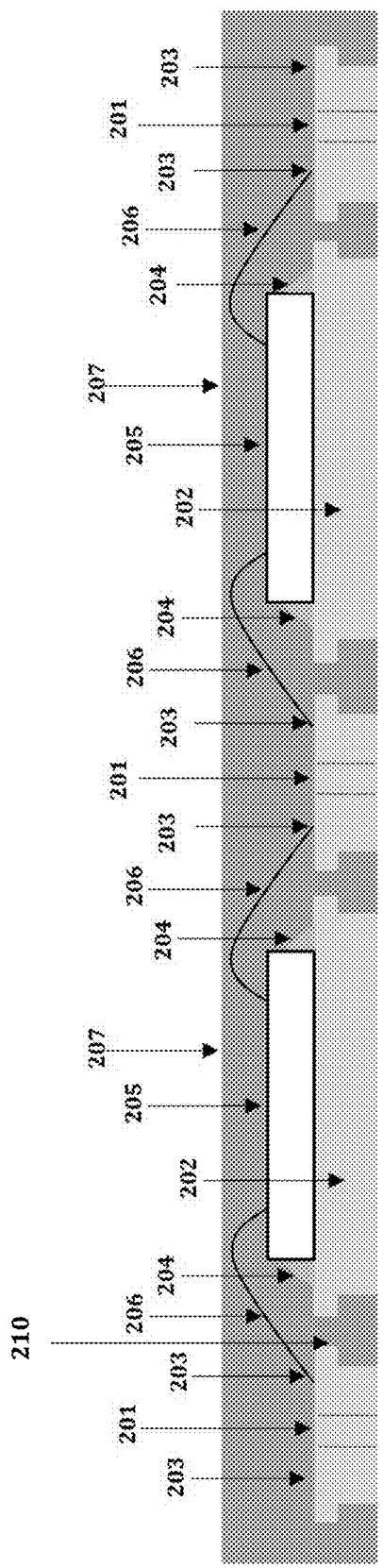
FIG. 6 is a cutaway schematic side view of the encapsulation of the package components.

FIG. 6 illustrates encapsulation of the chip and top portion of the lead frame. In the embodiment, protrusions 210 assist in preventing delamination or other degradation of the encapsulation of the package components. A non-limiting list of common encapsulants used in the industry include silica particulate-filled epoxy resins and liquid epoxy resins. The encapsulant is typically applied as a liquid or viscous liquid to the various elements which are mounted on or affixed to the lead frame. Curing the encapsulant yields a tough, durable coating which protects the underlying elements in the chip scale packages from damage.

Figure 7:
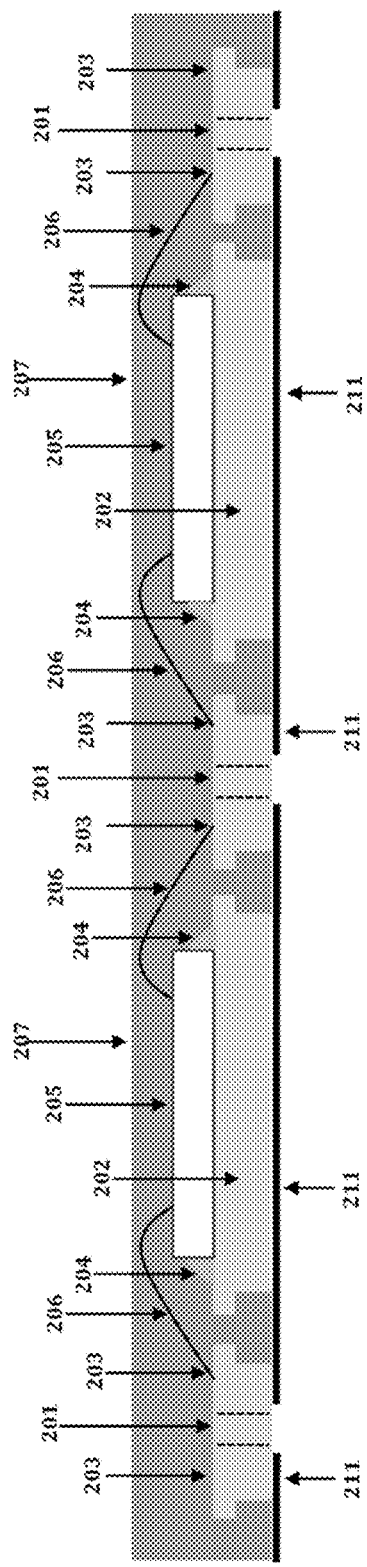
FIG. 7 is a cutaway schematic side view of the masking of a portion of the bottom of the packages.

FIG. 7 illustrates the masking of a portion of the underside of the packages, particularly the surface of the chip-pad and a portion of the surface of lead elements 201. A portion of the surface of lead elements 201 is left exposed. In the embodiment, this exposed area is symmetrically disposed in relation to the perpendicular axis of singulation. Masking 211 can be accomplished by any suitable means such as blue ink or silver. Other suitable masking substances include nickel/palladium/gold composite (NiPdAu), silver (Ag), antimony (Sn), nickel (Ni), or mixtures thereof, or any non-metallic or organic material or ink that can be applied or printed onto the lead frame. The masking may be oven- or UV-cured, as appropriate. Other suitable masks and photoresist substances are known to those of skill in the art.

Figure 8:
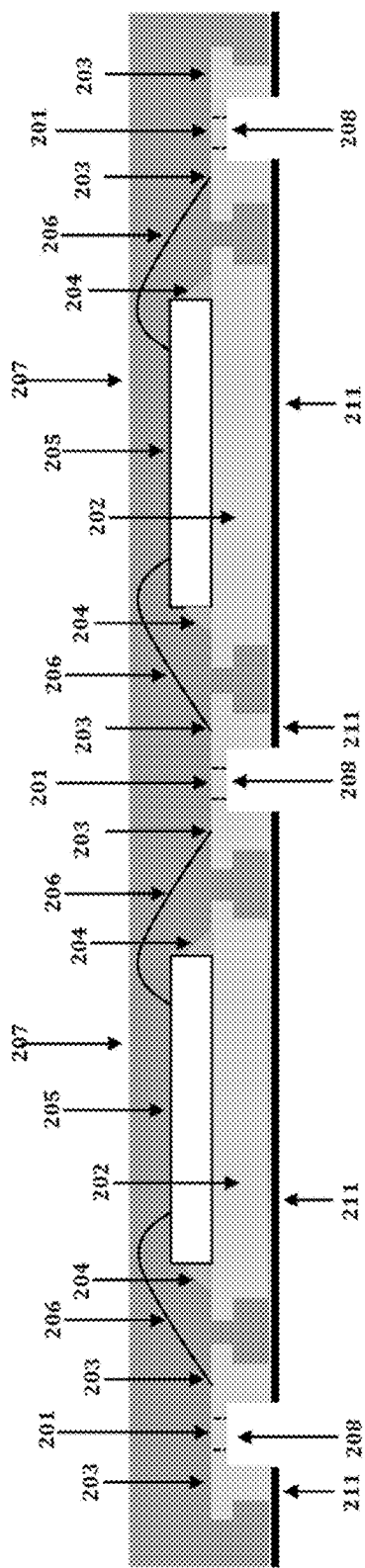
FIG. 8 is a cutaway schematic side view of the etching of fillets in the lead elements.
Figure 9:
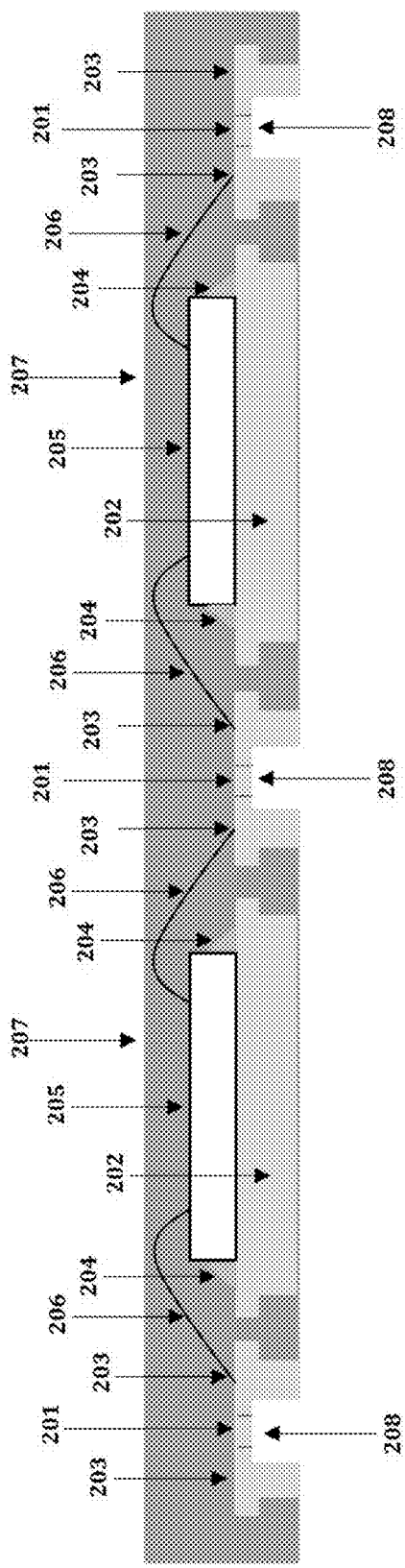
FIG. 9 is a cutaway schematic side view of masking being removed from the bottom of the packages.
Figure 10:
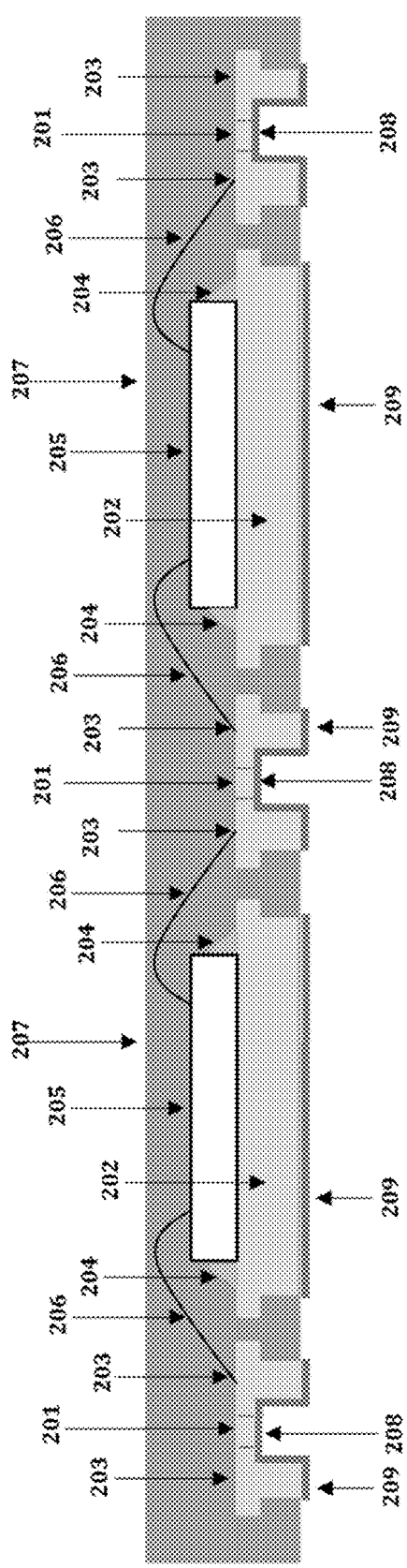
FIG. 10 is a cutaway schematic side view of the plating of lead elements and chip-pads.
Figure 11:
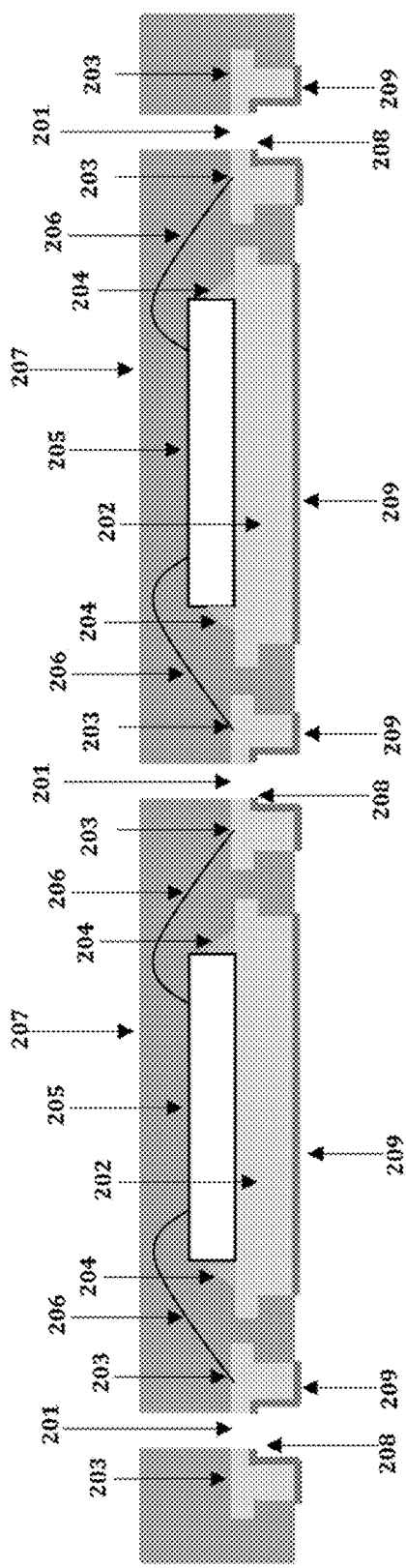
FIG. 11 is a cutaway schematic side view of the side of a singulated package.

FIG. 8 illustrates the etching of fillets. Fillets 208 are formed in lead elements 201 by any suitable etching process. Masking 211 allows targeted etching to create the desired size and depth. As seen in FIG. 9, masking 211 is then removed. As illustrated in FIG. 10, plating 209 is then applied to the bottom surfaces of lead elements 201, including fillets 208, as well as to the bottom surface of chip-pad 202. As seen in FIG. 11, the individual packages are then singulated. This may be accomplished by any suitable mechanism, including saw slicing, water-jet-cut, laser-cut, or a combination thereof as will be understood by those of skill in the art.

Figure 12:
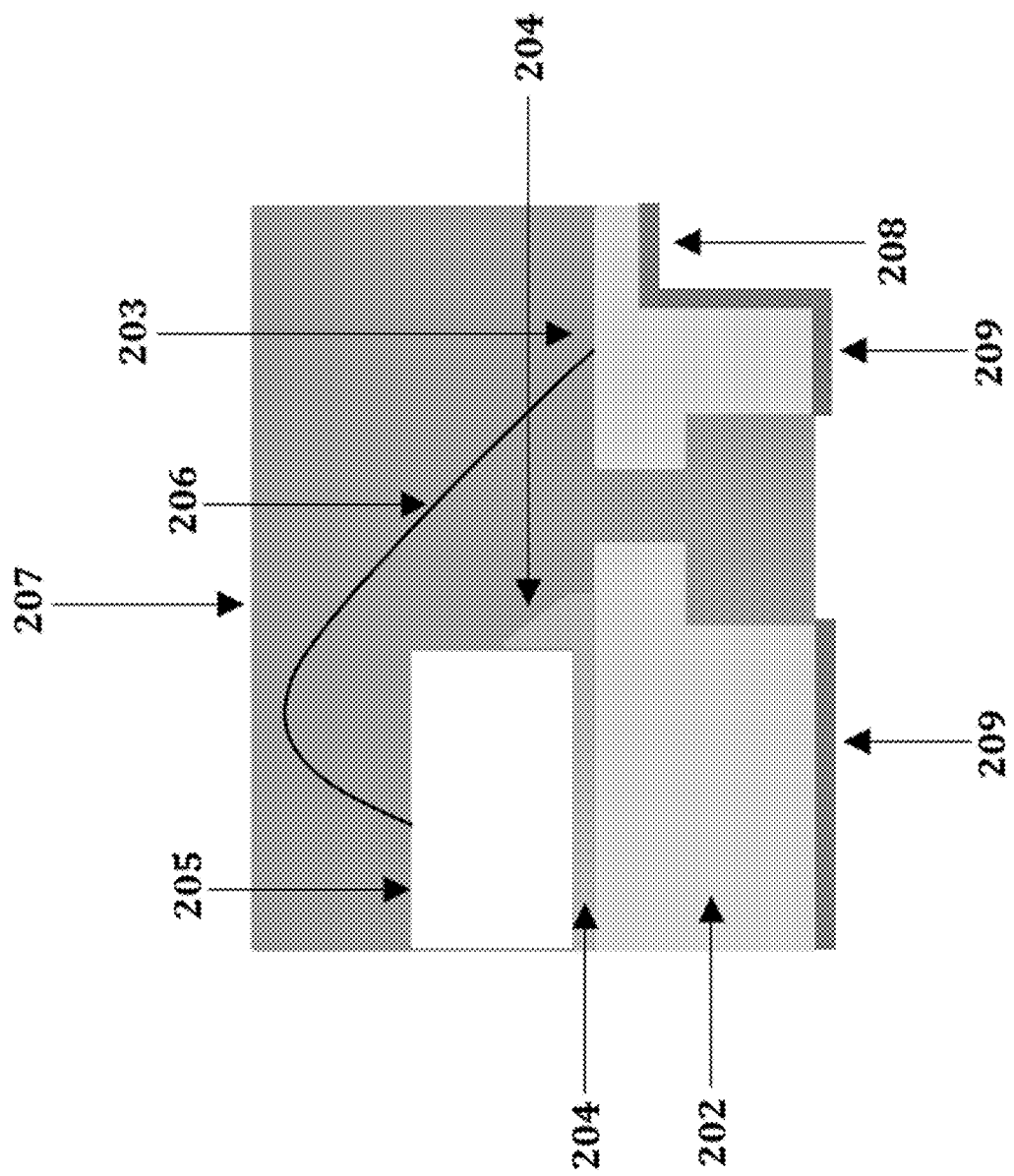
FIG. 12 is a magnified cutaway schematic side view of the edge of a singulated package.

FIG. 12 illustrates a cross section of the side of a singulated package. As is evident, fillet 208 and the bottom surface of lead 203 are plated, whereas a portion of lead 203 exposed by singulation is not. During connection of the package to a printed circuit board or other component, solder can reflow into fillet 208 and form a robust connection.

Figure 13:
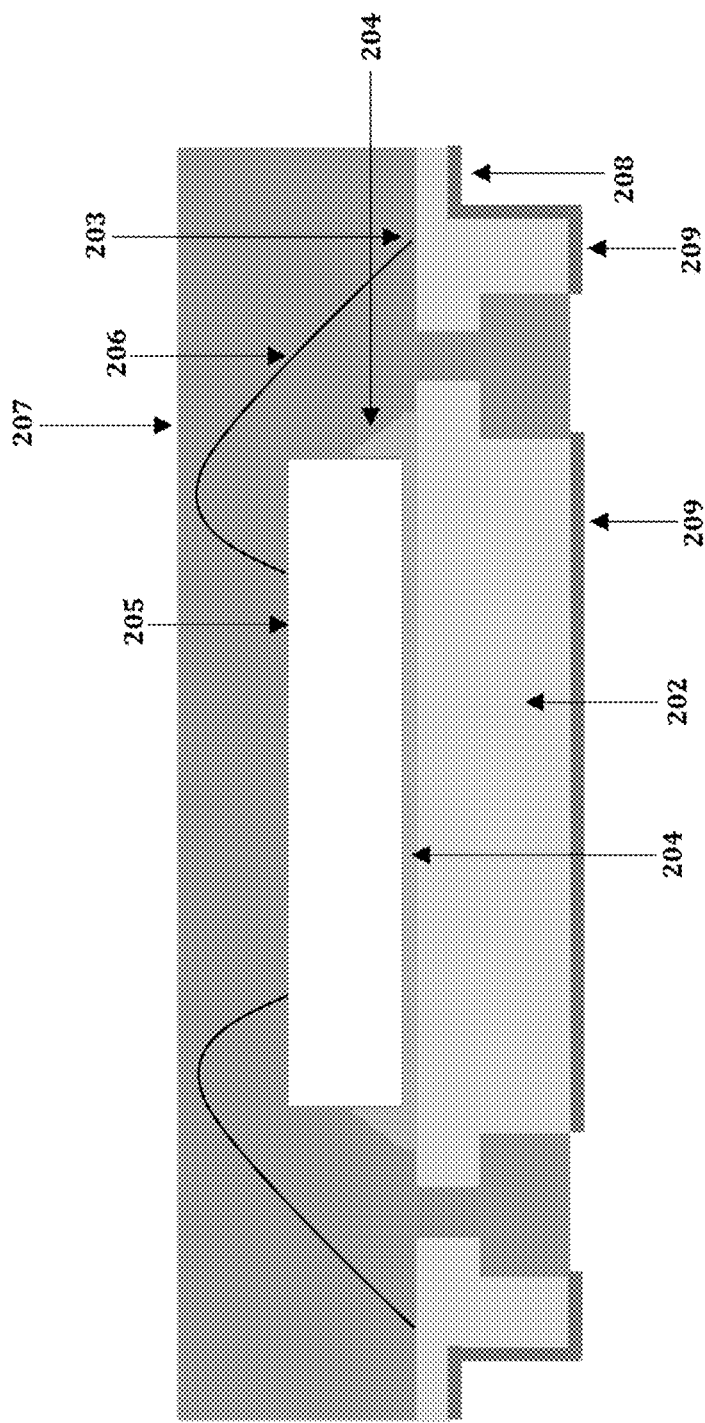
FIG. 13 illustrates a cutaway schematic side view of a finished QFN package.
Figure 14:
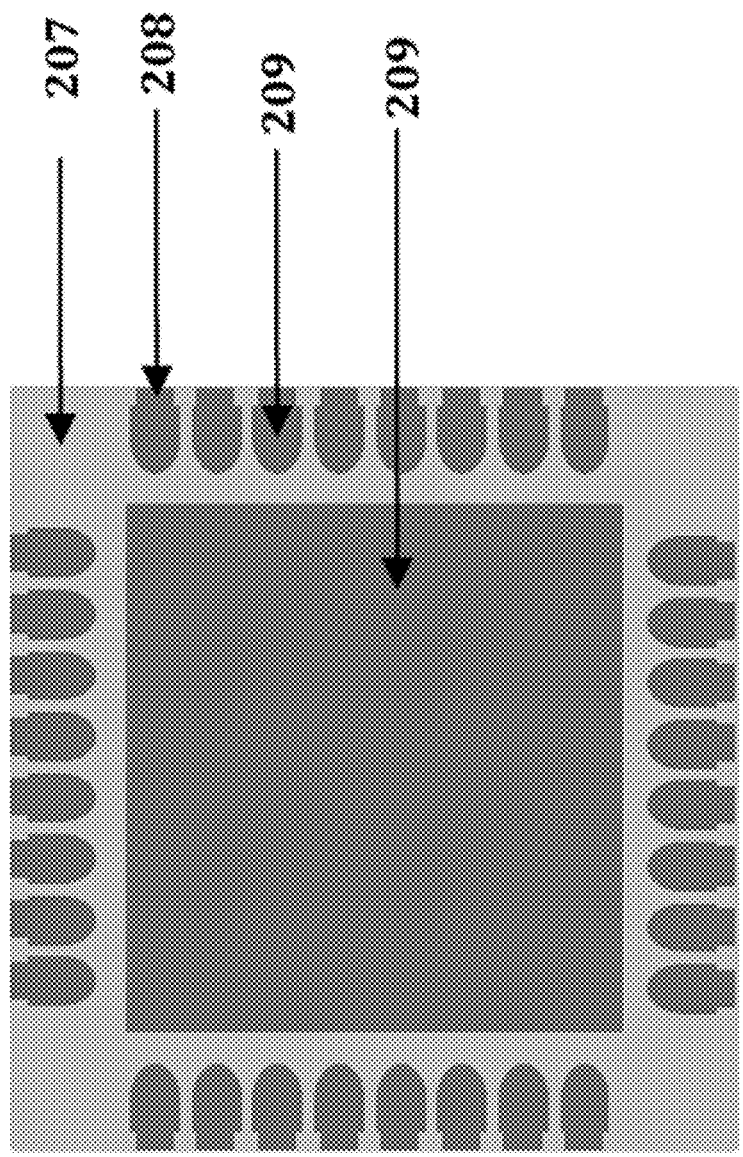
FIG. 14 is a schematic bottom view of a finished QFN package.

FIG. 13 illustrates a cross section of the singulated package of FIG. 11. FIG. 14 is a bottom view of the singulated package of FIG. 13.

Figure 15:
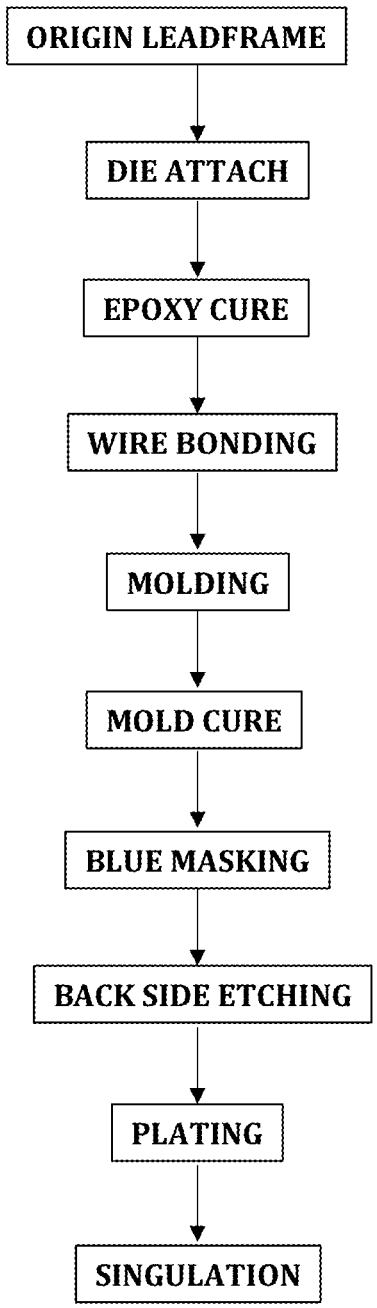
FIG. 15 is a flow chart diagram of an embodiment process.
Figure 16A:
FIGS. 16A-16F are diagrams of various cavities that can be used to provide anchoring means for encapsulating material.
Figure 16B:
Figure 16C:
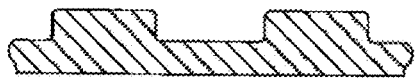
Figure 16D:
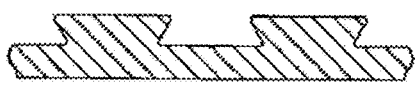
Figure 16E:
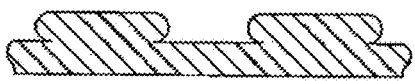
Figure 16F:
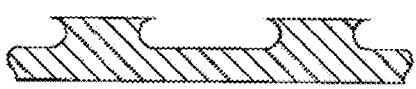

FIG. 15 is a flow chart diagram of an embodiment process.

In one embodiment, the partial patterning can vary from 25% to 90% of the thickness of the film. The partial patterning, however, may be virtually any percentage of the thickness of the film and the amount of partial etching can be determined by considering various factors affecting the manufacturability parameters, including flexibility, rigidity, and thermal thickness (or thermal conductance).

One of ordinary skill in the art to which the present application pertains will understand that chips may be alternatively mounted in a flip chip configuration.

The possibility of delamination between the molding material and the surfaces to which it should adhere can be reduced by half-etching the edges around the chip-pad and the contact areas to form a ledge or a "lip." It is also possible to form irregularly shaped cavities to enhance the interlocking mechanism of the surfaces that come into contact with the molding material. Enlarged views of various other cavities are also shown in FIGS. 16A-F, and forming of these surface enhancements can readily be incorporated as desired.

In certain alternative embodiments, the chip may be electrically connected with the leads in a flip-chip configuration.

Prior to singulation, a block of packages will inherently be ready for strip testing while the packages are still arranged in a matrix. This provides a significant advantage compared to handling the packages as individual units.

In certain embodiments, chips may be stacked. In brief, the first, lower chip is placed on a partially patterned lead frame which does not have a chip pad, and the chip is affixed to the lead frame using a die-attach material, such as an adhesive or an epoxy. The upper chip is then placed on top of and affixed to the lower chip using an adhesive substance such as a conductive or non-conductive epoxy, or an insulating material. The chips are electrically connected to the lead frame using wire bonding.

Chip-pads may be manufactured with a hatched bottom to reduce the surface area of contact with the printed surface board, thereby reducing the amount of solder voiding. Hatching or channels in the chip-pad may act as air vents so less air is trapped during reflow.

Figure 17A:
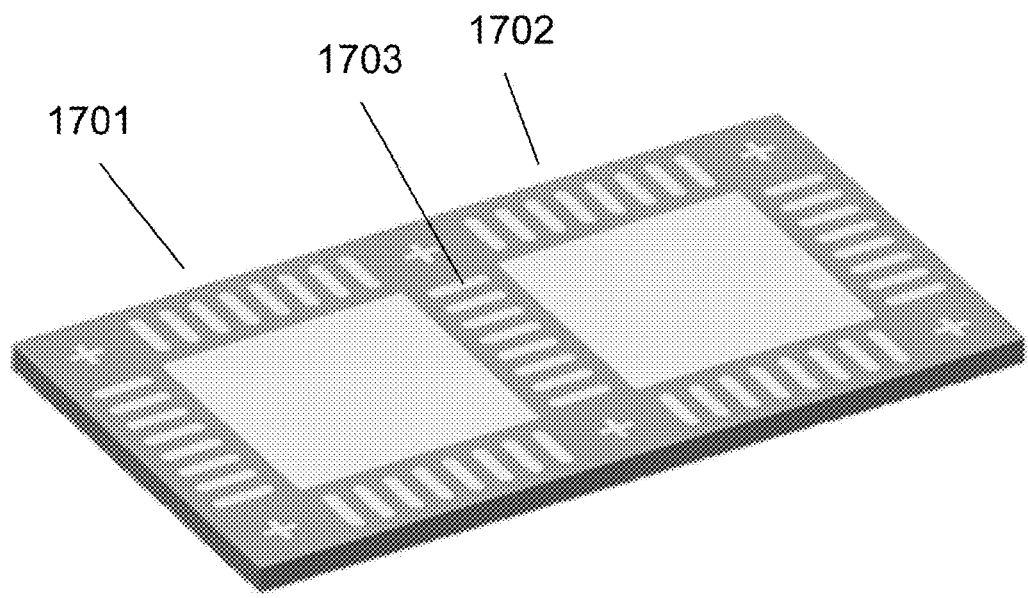
FIG. 17A is a bottom view of two unfinished QFN packages prior to fillet etching.
Figure 17B:
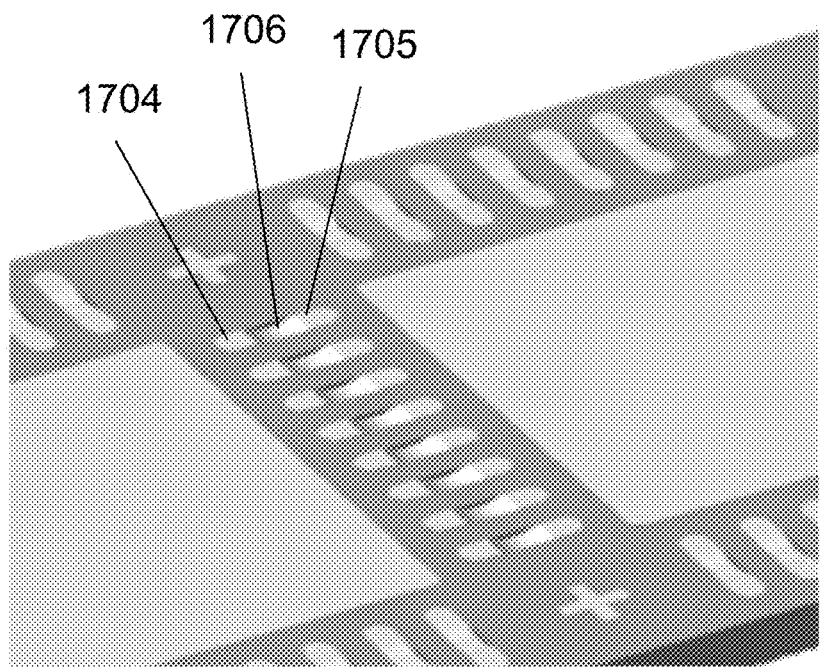
FIG. 17B is a close-up view of the unfinished QFN packages of FIG. 17A after fillet etching.

FIG. 17A illustrates a bottom view of adjacent unfinished QFN packages 1701 and 1702 that are still mated in a matrix for production. Those ordinary skill in the art to which the present disclosure pertains will appreciate that a matrix may include any appropriate number of QFN packages according to the manufacturing hardware being employed. Lead element 1703 temporarily connects what will eventually be separate leads for both QFN packages 1701 an 1702, forming a single element. The bottom surface of unfinished QFN packages 1701 and 1702 are partially masked so that a portion of lead element 1703 is left exposed. Preferably, the exposed area will be centrally located on lead element 1703 so that when QFN packages 1701 and 1702 are singulated, the resulting geometry of each package is approximately the same. Now with reference to FIG. 17B, the exposed area is etched so as to create fillet element 1704 between lead portion 1705 and lead portion 1706. Following the etching process, the lead elements are cleaned and plated. Finally, QFN packages 1701 and 1702 are singulated, so that leads that were etched have a wettable fillet.

Figure 18A:
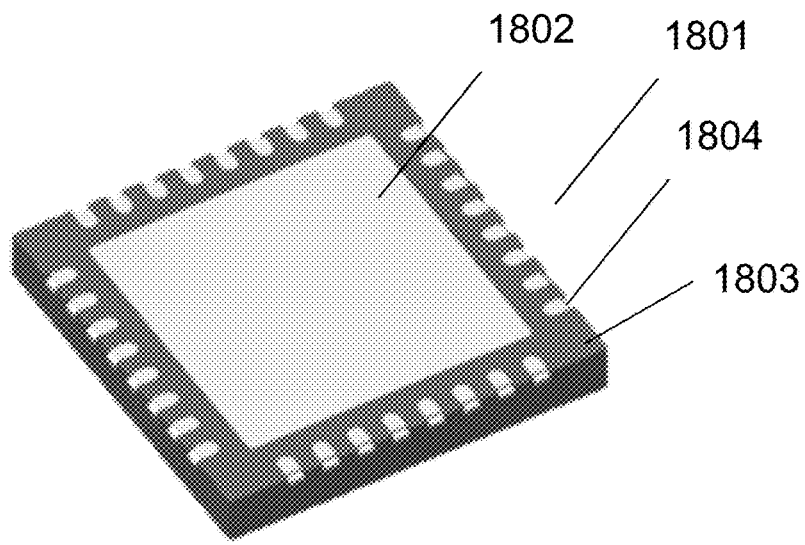
FIG. 18A is a bottom view of a QFN package according to an embodiment.

FIG. 18A depicts embodiment singulated QFN package 1801. Visible are chip pad 1802, encapsulating material 1803 and leads 1804. In the embodiment, all of the leads of QFN package 1801 have side fillets, but one of ordinary skill in the art to which the present disclosure pertains will understand that any desirable number of leads may or may not be etched so to have fillets.

Figure 18B:
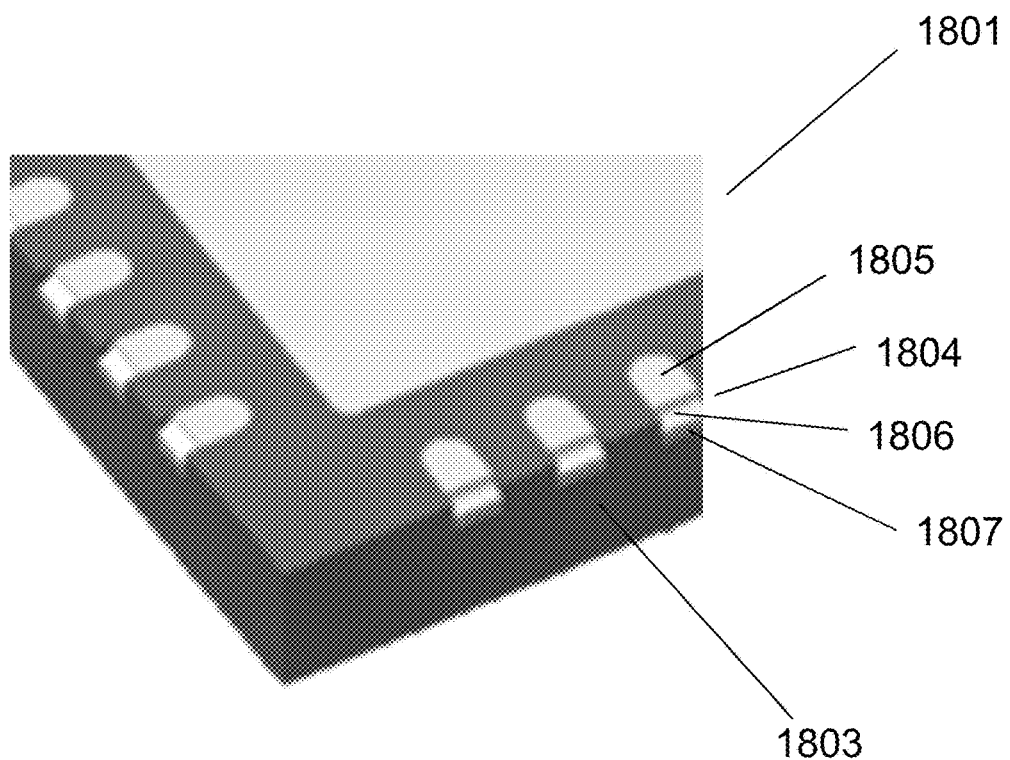
FIG. 18B is a close-up of the wettable flanks of the QFN package of FIG. 18A.

FIG. 18B is a close-up view of the unfinished QFN packages of FIG. 18A after fillet etching. Lead 1804 is characterized in part by first portion 1805 whose surface is substantially coplanar with the bottom of QFN package 1801 and which is plated. Fillet 1806 is below the plane of the bottom side of QFN package 1801 and is also plated. Lastly, second portion 1807 is an unplated area of the lead that was exposed by the singulation process.

The process of producing wettable flanks provides certain advantages. Specifically, the disclosed plated fillets allow solder to reflow into the fillet and thus establish a more resilient connection between the package and the apparatus to which it is attached, for instance to a printed circuit board. In certain applications, such as automotive applications, such durability is particularly desirable. Visual inspection of the fillet can confirm a positive connection.

The terms "bottom", "below", "top" and "above" as used herein do not necessarily indicate that a "bottom" component is below a "top" component, or that a component that is "below" is indeed "below" another component or that a component that is "above" is indeed "above" another component as such directions, components or both may be flipped, rotated, moved in space, placed in a diagonal orientation or position, placed horizontally or vertically, or similarly modified. Accordingly, it will be appreciated that the terms "bottom", "below", "top" and "above" may be used herein for exemplary purposes only, to illustrate the relative positioning or placement of certain components, to indicate a first and a second component or to do both.

Although the disclosed subject matter has been described and illustrated with respect to embodiments thereof, it should be understood by those skilled in the art that features of the disclosed embodiments can be combined, rearranged, etc., to produce additional embodiments within the scope of the disclosure, and that various other changes, omissions, and additions may be made therein and thereto, without parting from the spirit and scope of the present disclosure.

What is claimed:

1. A method of producing electronic packages, comprising the steps of:
   providing a metal film that is pre-plated on a top surface;
   patterning the pre-plating on the top surface of the film into lead frame elements, each including webbed portions, a chip-pad, a plurality of electrical lead elements, wherein the lead frame elements are formed of joined leads of adjacent packages, the lead frame elements including an unplated portion on a side surface of the package;
   back-patterning a bottom surface of the lead frames so as to remove the webbed portions, whereby the lead elements and the chip-pad are separated;
   attaching a chip to the chip-pad, wherein the chip is attached to a top surface of the chip pad via an adhesive substance;
   forming electrical connections between at least one terminal on the chip and one or more electrical lead portions of the lead elements;
   encapsulating the lead frames with encapsulant, wherein the encapsulant and the lead frames each include a bottom surface that is co-planar, the unplated portion being unexposed by the encapsulating;
   applying masking to bottom surfaces of the lead elements and the chip pad so as to leave exposed a portion of at least one of the lead elements;
   etching the exposed portion of the lead element so as to form a fillet;
   plating the fillet and bottom surfaces of the lead elements and chip-pad; and
   singulating the encapsulant material so as to form individual packages having plated flanks
   as a result of the singulating, exposing the unplated portion of at least one filleted lead frame element on the side face of the package.

2. The method of claim 1, wherein the fillet for each lead element is aligned with the axis of singulation, whereby the process of singulation produces an approximately equivalent wettable flank for each of the adjacent packages.

3. The method of claim 2 wherein the chip is electrically connected with the lead portions via wire bonding.

4. The method of claim 1 wherein a thickness of the plating is between approximately 300 and 800 micro inches.

5. The method of claim 1 wherein the masking is one of a silver or ink masking.

6. The method of claim 5 wherein the chip is attached to the chip pad with one of epoxy resin, a solder paste, or a tape.

7. The method of claim 1 wherein the patterning is accomplished with one of chemical, electrochemical, electrical discharge machining and photolithographic patterning.

8. The method of claim 7 wherein the patterning includes removing between 25% to 90% of the thickness of the film.

9. A method of producing wettable fillets in quad flat no lead (QFN) packages, comprising the steps of:
providing a matrix containing unfinished, un-singulated QFN packages;
wherein each un-singulated QFN package includes a plurality of lead elements and a chip pad; the lead elements formed of joined leads of adjacent packages, the lead frame elements including an unplated portion on a side surface of the package;
attaching to each chip pad at least one chip; wherein the chip is attached to a top surface of the chip pad via an adhesive substance;
electronically connecting at least one terminal on each chip to at least one lead portion of each lead element;
encapsulating a top portion of each QFN package with encapsulant, wherein the encapsulant and the lead frames each include a bottom surface that is co-planar, the unplated portion being unexposed by the encapsulating;
applying masking to a bottom surface of the lead elements and the chip pads, wherein at least a portion of the bottom surface of at least one lead element remains exposed;
etching the exposed portion of the lead elements so as to form fillets in the lead elements having an exposed area;
plating the bottom surface of the lead elements, fillets and chip pads; and
singulating the QFN packages, wherein QFN packages in which a lead element had a bottom surface possess at least one wettable flank,
as a result of the singulating, exposing the unplated portion of at least one filleted lead frame element on the side face of the package.

10. The method of claim 9, wherein the fillet for each lead element is aligned with the axis of singulation, whereby the process of singulation produces an approximately equivalent wettable flank for each of the adjacent packages.

11. The method of claim 10 wherein the exposed portion is, for each lead of the lead elements that is to be etched, approximately 25 percent of the bottom surface area of the lead element.

12. The method of claim 9 wherein a thickness of the plating is between approximately 300 and 800 micro inches.

13. The method of claim 12 wherein the masking is one of a silver or ink masking.

14. The method of claim 9 wherein the chip is attached to the chip pad with one of epoxy resin, a solder paste, or a tape.

15. The method of claim 14 wherein the chip is electrically connected with the lead portions via wire bonding.

16. The method of claim 9 wherein the chip is electronically connected with the lead portions in a flip chip manner.

17. The method of claim 1, wherein, prior to the exposing, the unplated portion does not oxidize.

* * * * *